United States Patent
Ou et al.

(10) Patent No.: US 9,204,571 B2
(45) Date of Patent: Dec. 1, 2015

(54) PORTABLE ELECTRONIC DEVICE

(71) Applicant: GIGA-BYTE TECHNOLOGY CO., LTD., New Taipei (TW)

(72) Inventors: Ting Kang Ou, New Taipei (TW); Yi Yuan Liu, New Taipei (TW); Mou Ming Ma, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 337 days.

(21) Appl. No.: 13/754,768

(22) Filed: Jan. 30, 2013

(65) Prior Publication Data

US 2014/0211420 A1    Jul. 31, 2014

(51) Int. Cl.
*H05K 7/20* (2006.01)
*G06F 1/16* (2006.01)
*G06F 1/20* (2006.01)

(52) U.S. Cl.
CPC ............... *H05K 7/20* (2013.01); *G06F 1/1656* (2013.01); *G06F 1/203* (2013.01)

(58) Field of Classification Search
CPC ....... H05K 7/10; H05K 7/20; H05K 7/20281; H05K 7/20381
USPC .......................... 361/716, 730, 694, 695, 697, 361/679.26–679.3, 679.31–679.39
IPC .................. H05K 7/10, 7/20, 7/20281, 7/29381
See application file for complete search history.

(56) References Cited

U.S. PATENT DOCUMENTS

| | | | | |
|---|---|---|---|---|
| 6,421,237 B1 * | 7/2002 | Kim | ............ | 361/679.41 |
| 7,099,151 B2 * | 8/2006 | Jones et al. | ............ | 361/679.02 |
| 7,307,834 B2 * | 12/2007 | Jones et al. | ............ | 361/679.55 |
| 7,568,517 B2 * | 8/2009 | Hwang et al. | ............ | 165/80.2 |
| 7,969,733 B1 * | 6/2011 | Abbay et al. | ............ | 361/695 |
| 8,625,266 B2 * | 1/2014 | Pu et al. | ............ | 361/679.26 |
| 2003/0048622 A1 * | 3/2003 | Kim et al. | ............ | 361/796 |
| 2004/0085726 A1 * | 5/2004 | Ting et al. | ............ | 361/686 |
| 2006/0087511 A1 * | 4/2006 | Lee | ............ | 345/520 |
| 2007/0159802 A1 * | 7/2007 | Wang | ............ | 361/737 |
| 2010/0254096 A1 * | 10/2010 | Kim et al. | ............ | 361/737 |
| 2011/0249392 A1 * | 10/2011 | Kadri et al. | ............ | 361/679.37 |
| 2011/0252249 A1 * | 10/2011 | Wang et al. | ............ | 713/300 |
| 2012/0162898 A1 * | 6/2012 | Weng et al. | ............ | 361/679.33 |

FOREIGN PATENT DOCUMENTS

| | | |
|---|---|---|
| CN | 201616042 U | 10/2010 |
| TW | M276254 U | 9/2005 |
| TW | 200745826 A | 12/2007 |

* cited by examiner

*Primary Examiner* — Anthony Haughton
*Assistant Examiner* — Matt Dhillon
(74) *Attorney, Agent, or Firm* — Chun-Ming Shih

(57) ABSTRACT

A portable electronic device includes a main body, a motherboard, at least one connector, and at least one external graphics card module. The motherboard is disposed within the main body and equipped without a built-in graphics chip. The connector is disposed on the motherboard. The main body has at least one slot, and the slot is disposed at a position corresponding to the position of the connector. The external graphics card module includes a circuit board, and a graphic processing unit and a first connecting interface are electrically disposed on the circuit board. The external graphics card module is removable and selectively inserts into the slot, and the external graphics card module electrically connects to the motherboard via the first connecting interface.

8 Claims, 8 Drawing Sheets

# PORTABLE ELECTRONIC DEVICE

BACKGROUND OF THE INVENTION

1. Field of the Invention

The present invention relates to a portable electronic device, especially to a portable electronic device having a removable external graphic card module.

2. Description of Related Art

As the rise of high definition dynamic imaging technology and 3D games, software for 3D animation or high definition imaging is widely prevalent in the market. For such a purpose, computer systems have to be equipped with higher computation ability to process a huge amount of data, so as to provide faster image processing performance. For computer systems, a graphic card is a major part for image processing. In a portable electronic device, such as a notebook or an all-in-one computer, an independent graphic processing unit (GPU) is widely utilized instead of an integrated GPU. In the field of personal computers and computer graphic (CG) workstations, the high performance graphic card with high computation ability and excellent capability of graphic processing are adopted by more and more graphics processing workers and 3D gaming enthusiasts, thus market demand for such a graphic card is greatly raised. Today, many electronic products manufacturers focus on development and production for own brand graphic card.

For enhance the ability to perform massive numbers of calculations required for graphics processing, the computer system has to be equipped with a higher performance of graphic card or multiple of graphic cards connected in series or in parallel. Conventionally, when the portable electronic device in the art is manufactured, the graphic card has been installed in the portable electronic device, the user cannot select or replace the graphic card according to the usage requirement to improve the display performance of the portable electronic device. Such a condition sometimes causes inconvenience. For example, when the users would like to use the computer to play 3D games, and the games usually cannot be executed smoothly. The games are delayed, the operability is poor, and the user is disappointed.

Therefore, to make the graphic card in an electronic device be easily replaced is a general purpose of the electronic products and graphic card manufacturers.

SUMMARY OF THE INVENTION

In view of the above problems, the present invention provides a portable electronic device with the external graphic card module, in which the external graphic card module can be replaced easily, so as to solve the above problems.

In one or more embodiments, a portable electronic device includes a main body, a motherboard, at least one connector and at least one external graphic card module. The motherboard is equipped without a built-in graphics chip, and the motherboard is disposed within the main body. The connector is electrically disposed on the motherboard. The main body includes at least one slot disposed on one side of the main body, and the connector is located corresponding to the slot of main body. The external graphic card module includes a graphic processing unit, a circuit board and a first connecting interface. The graphic processing unit is electrically disposed on the circuit board. The first connecting interface is electrically disposed to an end of the circuit board. The external graphic card module is removable and selectively inserting into the slot to electrically connect to the connector of the motherboard through the first connecting interface.

Through the present invention, the external graphic card module of the portable electronic device can be easily replaced, such that the user can choose a proper external graphic card module according to the user requirement. The consumer can use the portable electronic device with flexibility. Furthermore, the portable electronic device is able to be equipped with multiple external graphic card module working together to increase the image display function of the portable electronic device.

These and other objectives of the present invention will no doubt become obvious to those of ordinary skill in the art after reading the following detailed description of the preferred embodiments that is illustrated in the various figures and drawings.

DETAILED DESCRIPTION OF THE PREFERRED EMBODIMENTS

It is noted that in the following embodiments a portable electronic device 100 is but not limited to a notebook, a tablet computer or any portable electronic products, and a notebook is used as an exemplary interpretation of a portable electronic device 100 without any intention to limit the scope of the present invention. Those skilled in the art may modify the appearance and the function of the portable electronic device 100 according to user requirements.

Figure 1:
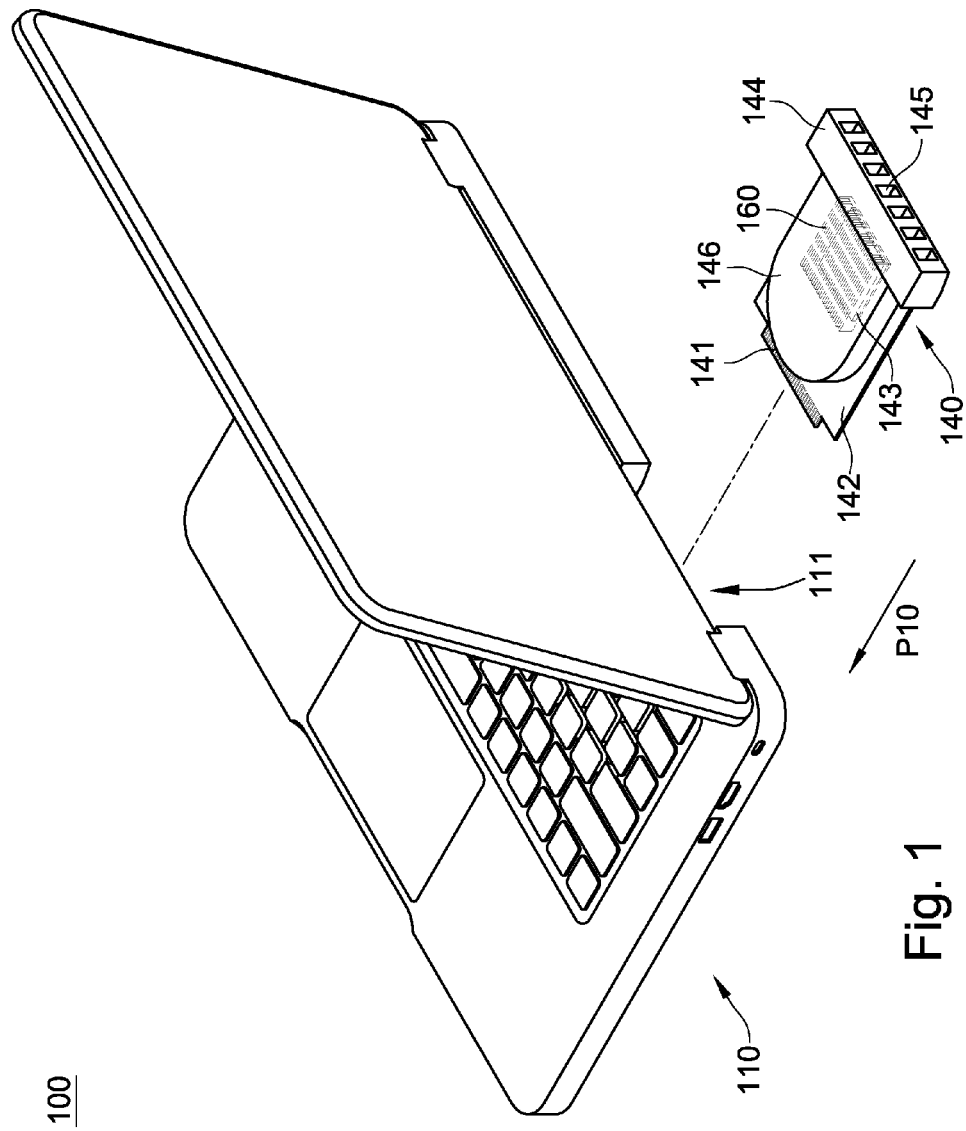
FIG. 1 is a partial breakdown diagram of a first embodiment of the present invention.
Figure 2:
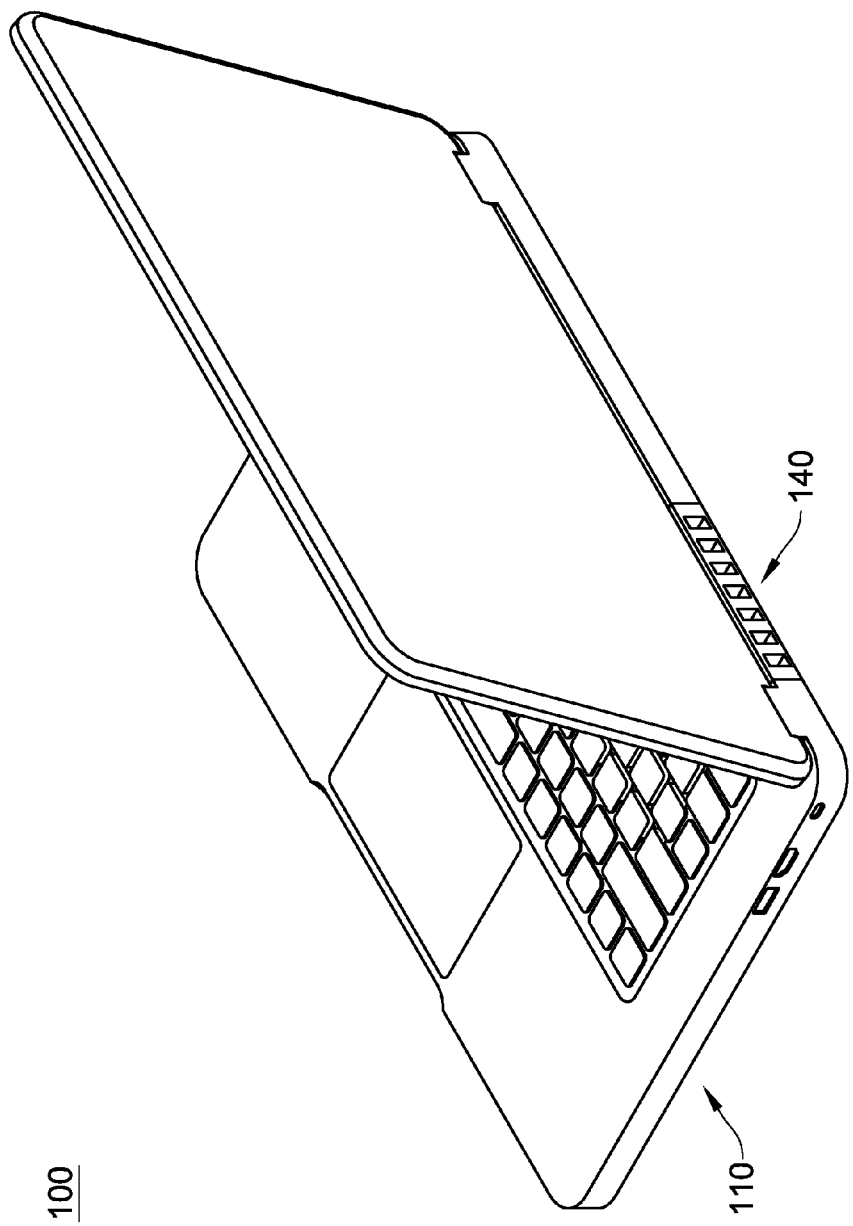
FIG. 2 is a perspective view of the first embodiment of the present invention.

FIGS. 1 and 2 are partial breakdown diagrams and perspective view of the portable electronic device 100 of the first embodiment. The motherboard 120 is similar to a conventional motherboard of computer, which is configured for executing default functions such as transmitting electrical signals, executing application software, and storing and computing digital data. The details related to the above functions are well known by those of ordinary skill in the art and not described hereinafter. The electrical components involved in the present invention will be explicitly interpreted in the following paragraphs.

Figure 7:
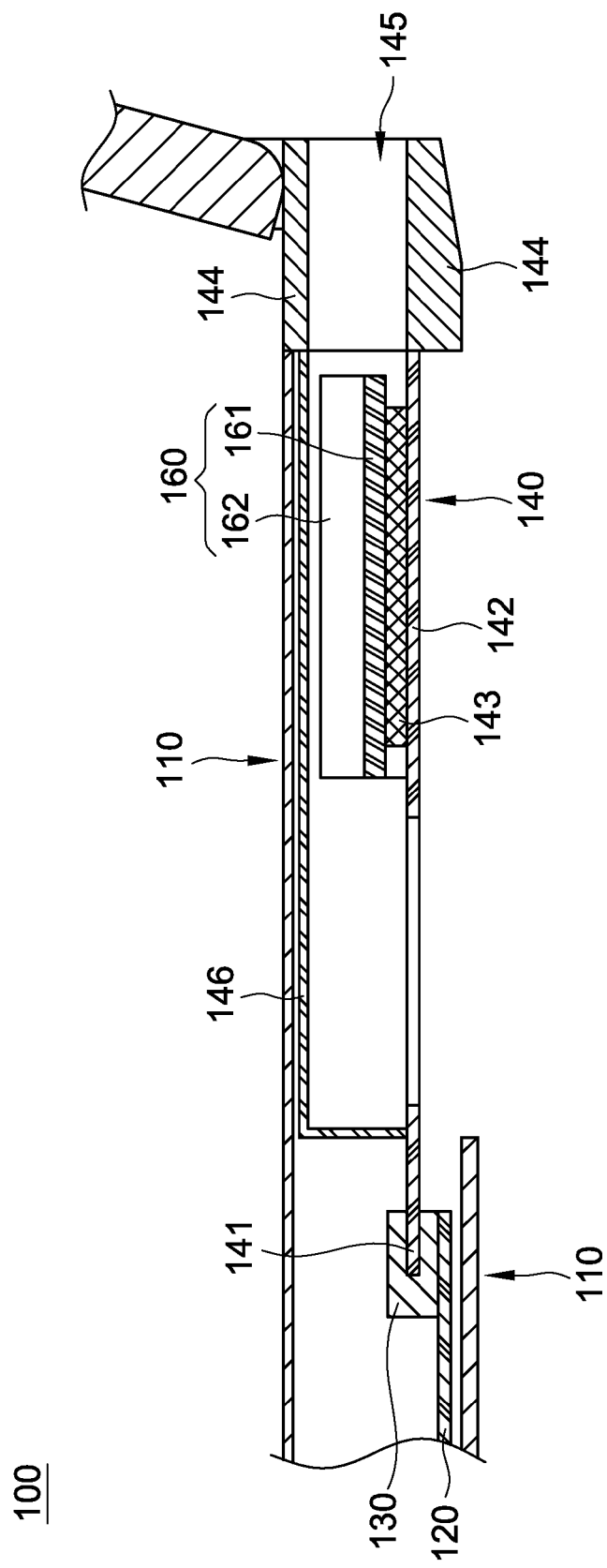
FIG. 7 is a cross-sectional view of the portable electronic device of the present invention.

Referring to FIG. 7, in the first embodiment, the portable electronic device 100 includes a main body 110, a motherboard 120, at least one connector 130 and at least one external graphic card module 140. The motherboard 120 is disposed within the main body 110, and the motherboard is equipped without a built-in graphics chip. The connector 130 is disposed on the motherboard 120, and electrically connected to the motherboard 120 to transmit electrical signals to the motherboard 120. The main body 110 has at least one slot 111 disposed on a back side of the main body 110. The slot 111 is located corresponding to the connector 130, and the slot 111 is electrically connected to the other components of the main body 110.

In this embodiment, the external graphic card module 140 is but not limited to a hot-plug device. The external graphic card module 140 includes a graphic processing unit 143, a circuit board 142 and a first connecting interface 141. The graphic processing unit (GPU) 143 is provided for graphics computation and the GPU 143 is electrically disposed on the circuit board 142. The first connecting interface 141 is electrically disposed to an end of the circuit board 142, the external graphic card module 140 is removable and selectively inserts into the slot 111 of the main body 110 along an assembly direction P10. The external graphic card module 140 is electrically connected to the connector 130 of the motherboard 120 through the first connecting interface 141 of the circuit board 142, so as to establish electrical connection between the external graphic card module 140 and the motherboard 120 to transmit the electrical signals of the graphic processing unit 143 via the first connecting interface 141 to the motherboard 120.

To sum up, in the embodiment, through the slot, the portable electronic device 100 selectively connects to an external graphic card module 140 with demanding specification, so as achieve the requirement of the user. Furthermore, the user can easily replace the external graphic card module 140 with another one, so that the user can use the portable electronic device with more flexibility.

Figure 3:
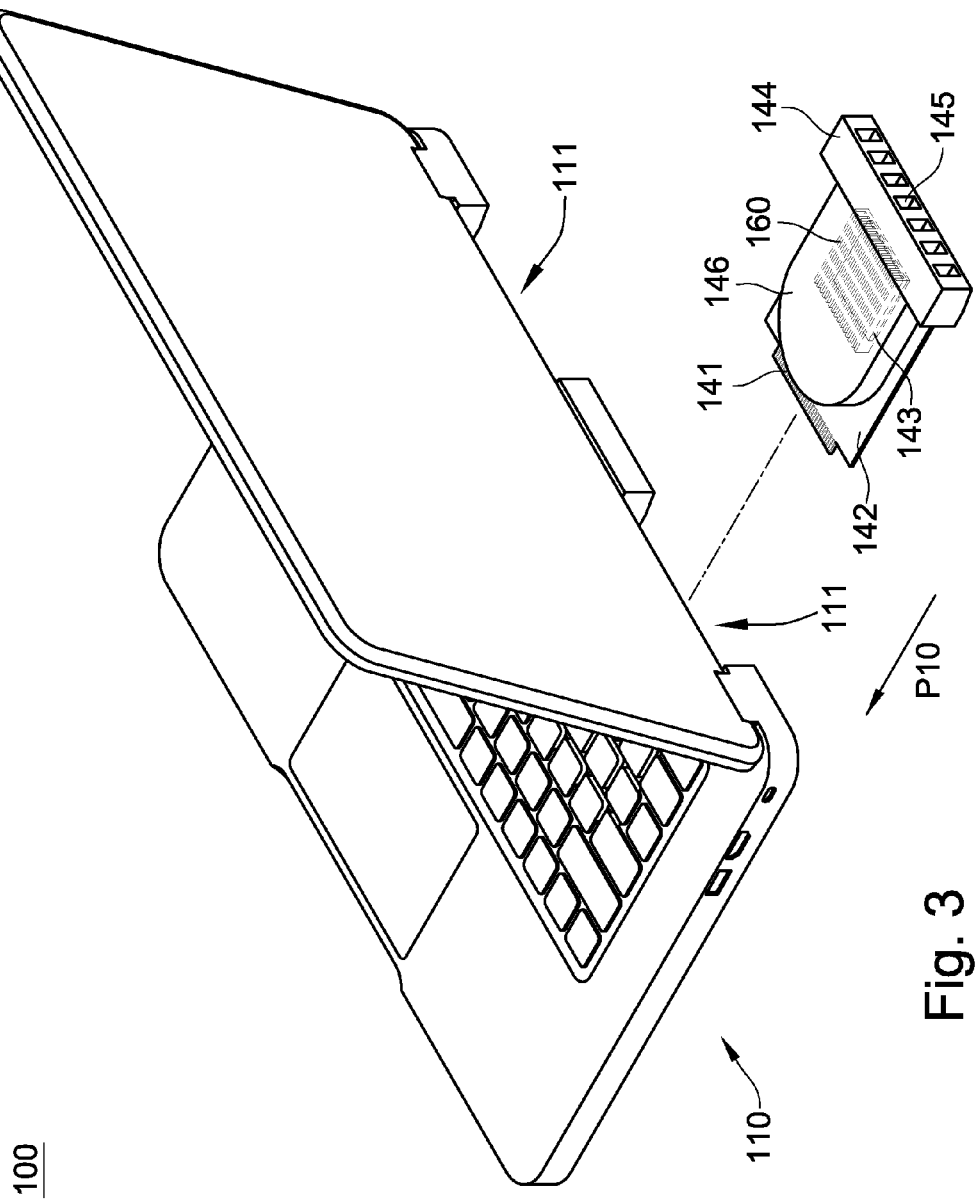
FIG. 3 is a partial breakdown diagram of a second embodiment of the present invention.
Figure 4:
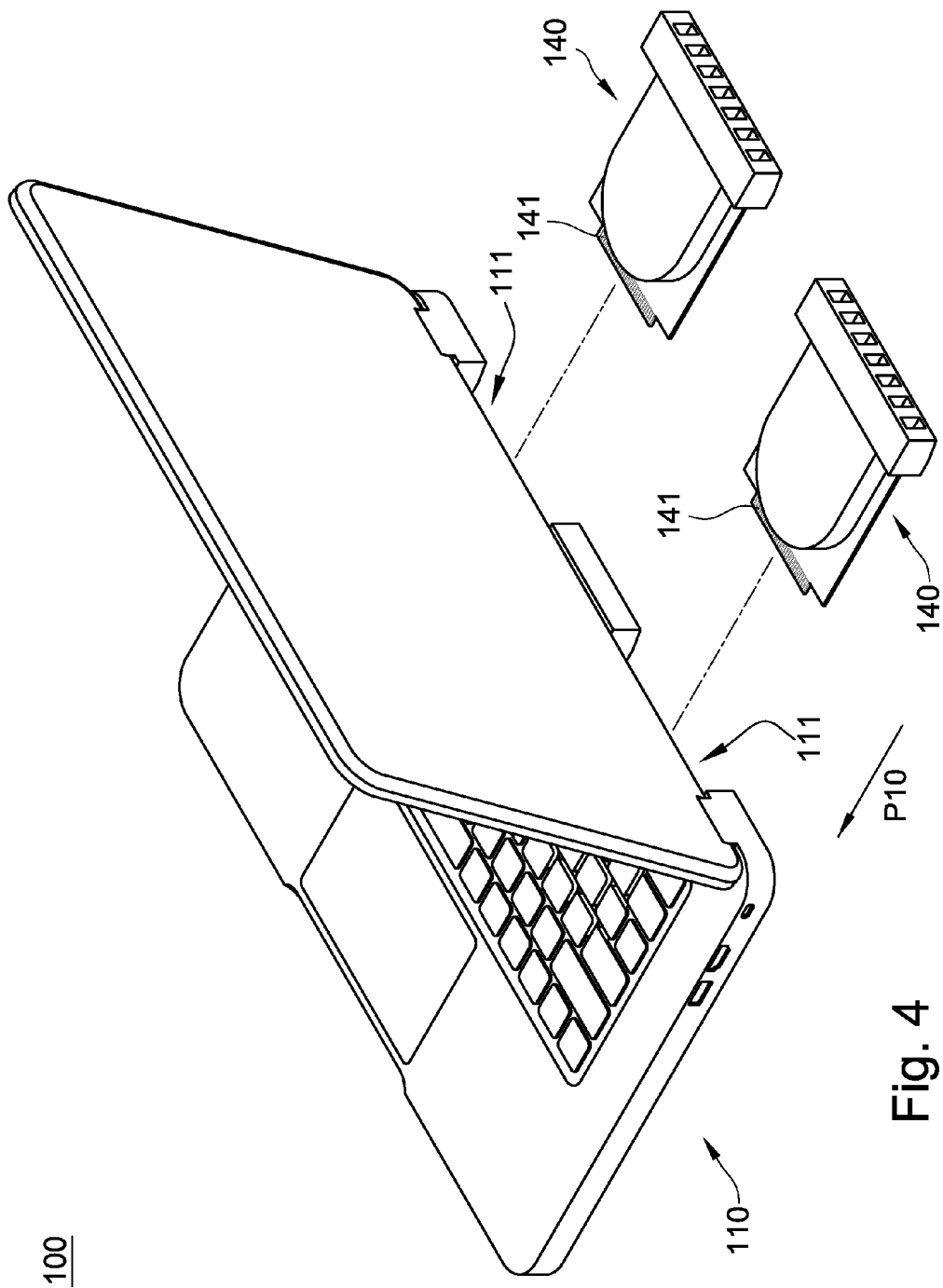
FIG. 4 is a partial breakdown diagram of two external graphic card module of the second embodiment of the present invention.
Figure 5:
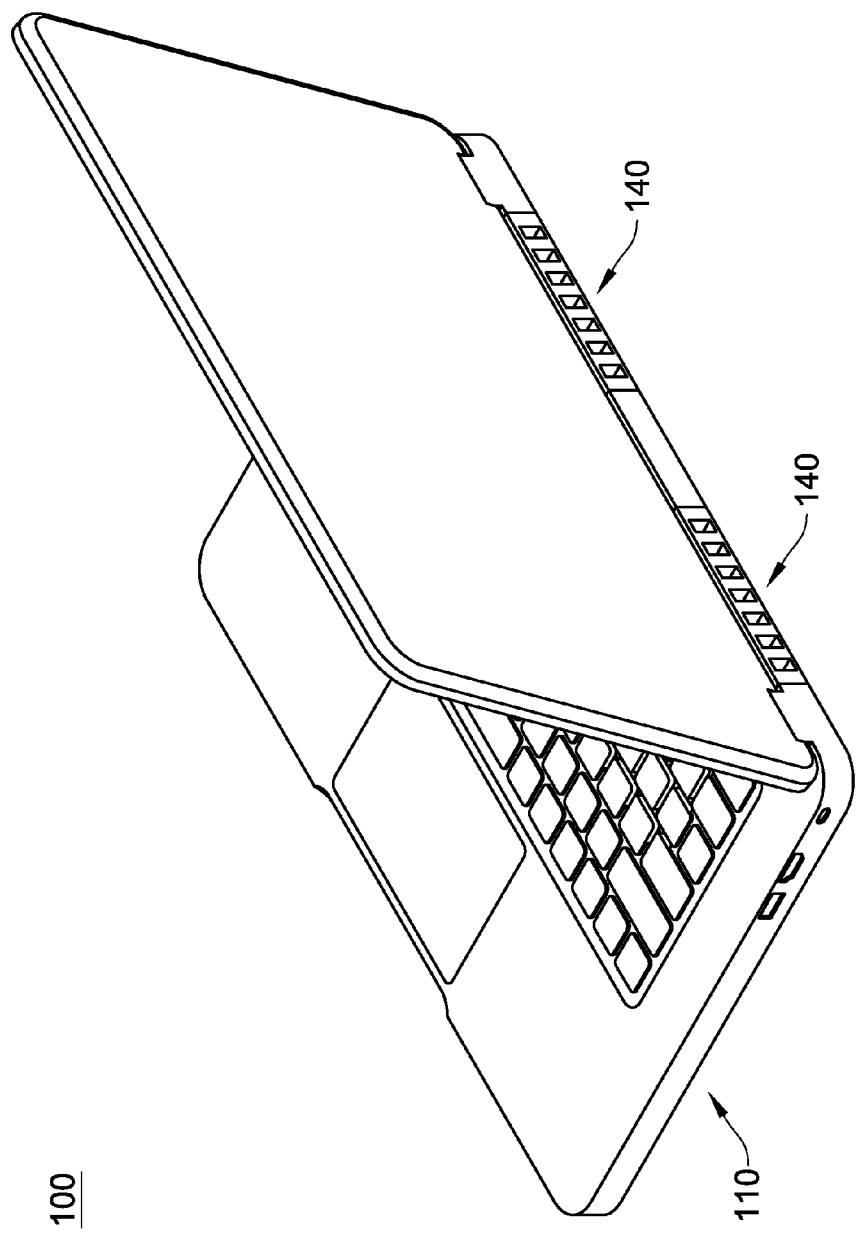
FIG. 5 is a perspective view of two external graphic card module of the second embodiment of the present invention.

FIGS. 3 to 5 are partial breakdown diagrams and perspective view of the portable electronic device 100 of the second embodiment. The structure of a portable electronic device 100 of the second embodiment is basically similar to that of the first embodiment with only some differences that will be addressed hereinafter.

Referring to FIG. 7, in the second embodiment, the portable electronic device 100 includes a main body 110, a motherboard 120, two connectors 130 and two external graphic card modules 140. The motherboard 120 is disposed within the main body 110 and is equipped without a built-in graphics chip. The connectors 130 are respectively disposed on the motherboard 120, and electrically connected to the motherboard 120 to transmit the electrical signals. The main body 110 has two slots 111 disposed on a back side of the main body 110. The two slots 111 are respectively located corresponding to the two connectors 130, and the two slots 111 are respectively communicated with the other components of the main body 110.

The difference between the portable electronic device 100 of the second embodiment and that of the first embodiment is that in the second embodiment one or both the two slots 111 of the main body 110 can be selectively inserted by different external graphic card modules 140. In more detail, when an external graphic card module 140 inserts into one of the two slots 111 of the main body 110, another slot 111 can adopt another external graphic card module 140 or remain un-occupied by any interface card module.

It is noted that the quantity of the slot 111 and external graphic card module 140 are not limited to those examples above, and the slot 111 may be disposed in any desired positions on the portable electronic device 100 by using other arrangement other than that disclosed above.

To sum up, in the embodiment, through two slots the portable electronic device 100 can selectively connects to one or more external graphic card modules 140 with demanding specifications according to the requirement of the user. Furthermore, the user can easily replace any one of the external graphic card modules 140 with another one. When two or more external graphic card modules 140 are adopted by the portable electronic device 100, Scalable Link Interface (SLI) technology can be use to make the external graphic card modules 140 cooperate, so that the performance will be increased to attain the good performance of display function.

Figure 6:
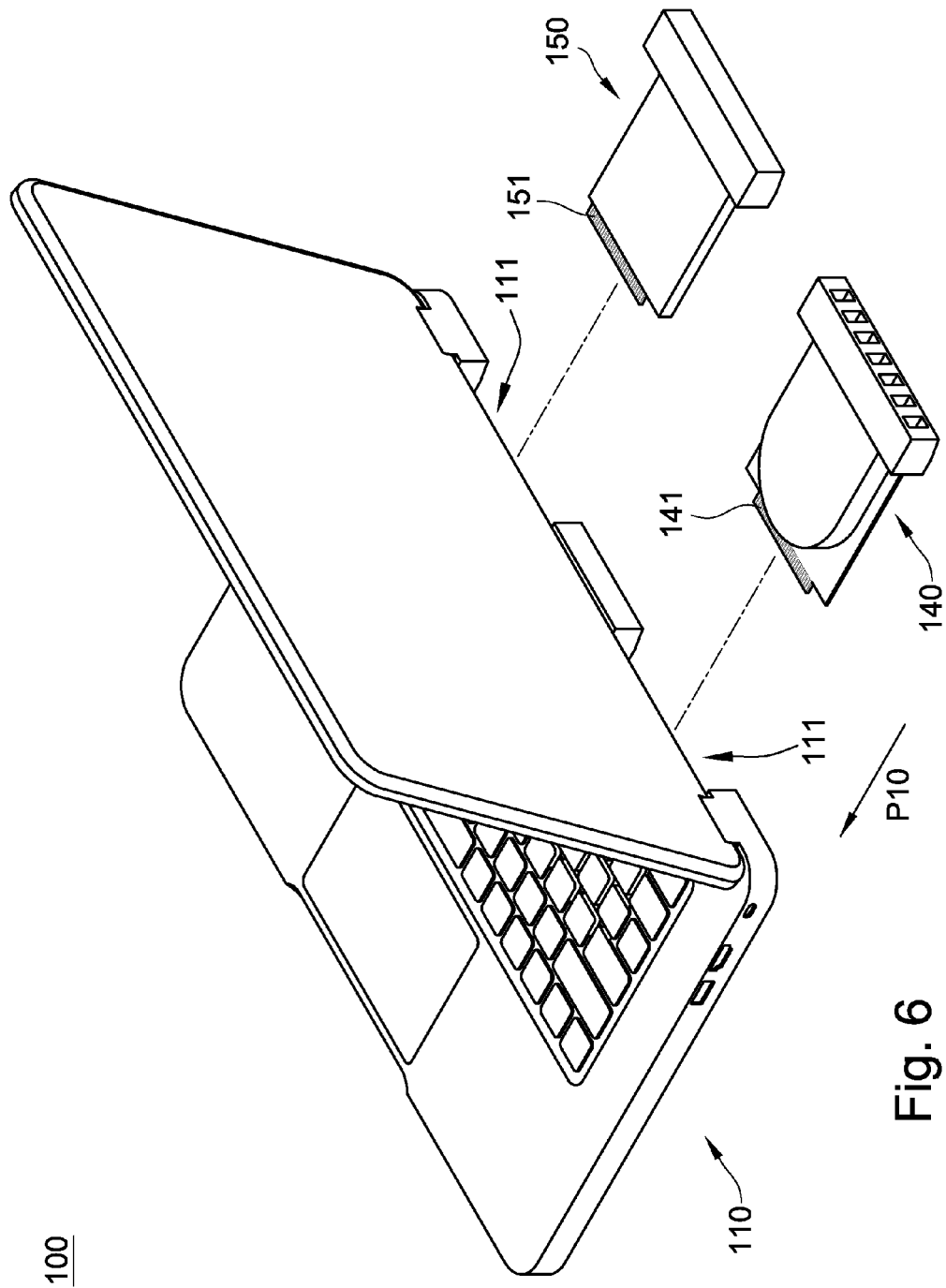
FIG. 6 is a partial breakdown diagram of the external graphic card module and an interface card module of a third embodiment of the present invention.

FIG. 6 is a partial breakdown diagram of the external graphic card module and an interface card module of the third embodiment. The structure of a portable electronic device 100 of the third embodiment is basically similar to that of the first embodiment and the second embodiment with only some differences that will be addressed hereinafter.

Referring to FIG. 7, in the first embodiment, the portable electronic device 100 includes a main body 110, a motherboard 120, two connectors 130 and an external graphic card module 140. The motherboard 120 is disposed within the main body 110 and is equipped without a built-in graphics chip. The connectors 130 are respectively disposed on the motherboard 120, and electrically connected to the motherboard 120 to transmit the electrical signal. The main body 110 has two slots 111 disposed on a back side of the main body 110. The two slots 111 are respectively located corresponding to the two connectors 130, and the two slots 111 are respectively communicated with the electronic components of the main body 110.

The difference between the portable electronic device 100 of the third embodiment and that of the other embodiment is that the portable electronic device 100 of the third embodiment further includes an interface card module 150 with a second connecting interface 151. The interface card module 150 is but not limited to a wireless network interface card an audio card or a solid state disk. The two slots 111 of the main body 110 can be selectively inserted by different external graphic card module 140. In more detail, when an external graphic card module 140 inserts into one of the two slots 111 of the main body 110, the interface card module 150 can insert into another slot 111 through the second connecting interface 151. It is noted that the quantity of the slot 111 and external graphic card module 140 are not limited to those examples above, and the slot 111 may be disposed at any desired positions on the portable electronic device 100 by using other arrangement other than that disclosed above.

To sum up, in the third embodiment, through two slots and one interface card module, the portable electronic device 100 selectively connects to interface card module with various through one of the slot of the main body. Therefore, the user can choose the external graphic card module and the interface card module among various options according to the requirement, so that the user can use the portable electronic device with more flexibility and more options.

FIG. 7 is a cross-sectional view of the portable electronic device of the present invention. In order to dissipate the heat of the portable electronic device 100, in the aforementioned embodiments, the portable electronic device 100 further includes a heat sink 160. The heat sink 160 has a thermal conducting board 161 and a plurality of fins 162. The external graphic card module 140 has a cover 146 disposed on the motherboard 120, and the heat sink 160 and the graphic processing unit 143 are located within the cover 146. A bottom of the thermal conducting board 161 is pasted with the heat conductive grease (not shown in the drawing) and attached on the circuit board 142. The thermal conducting board 161 contacts with the graphic processing unit 143 via heat conductive grease, so as to improve the efficiency of dissipating the heat of the portable electronic device 100. The fins 162 are arranged on a top of the thermal conducting board 161 by integrated as a whole, buckling, wedging or other means. The fins 162 are used to enhancing the thermal conducting board 161 to dissipate the heat of the graphic processing unit 143, so as to protect the graphic processing unit 143 from being damaged due to over heating.

Besides, in the aforementioned embodiments, the portable electronic device 100 further includes an exhausting region 144 with a plurality of vents 145. The exhausting region 144 is communicated with the cover 146. The vents 145 are exposed to the outer surface of the main body 110. When the exhausting region 144 flush with the main body, and the heat of the graphic processing unit 143 is dissipated from the vents 145 to external, so as to enhance the efficacy of heat dissipation.

The structure of a portable electronic device 100 of the fourth embodiment is basically similar to that of the aforementioned embodiments with only some differences that will be addressed hereinafter.

Figure 8:
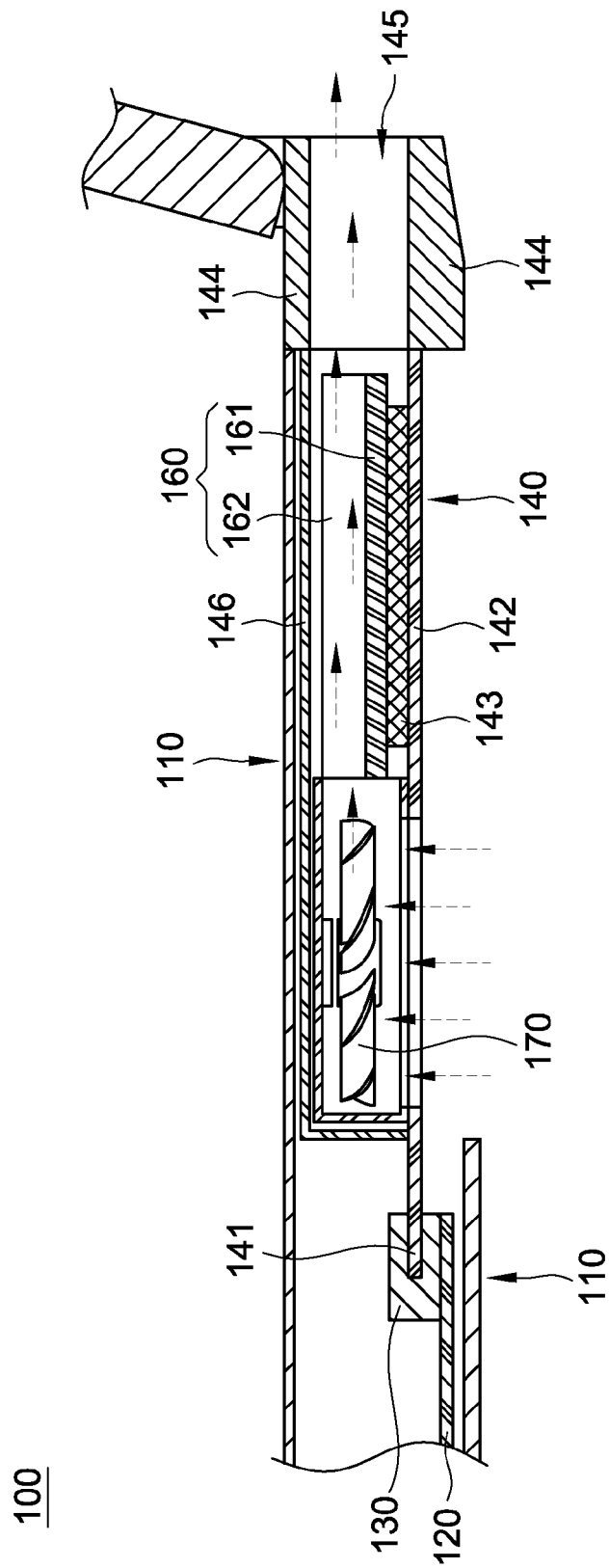
FIG. 8 is a cross-sectional view of the fan of a fourth embodiment of the present invention.

FIG. 8 is a cross-sectional view of the fan of a fourth embodiment of the present invention. The difference between the fourth embodiment and the aforementioned embodiments is that the portable electronic device 100 further includes a fan 170 disposed on the circuit board 142 and located within the cover 146 of external graphic card module 140. The fan 170 is but not limited to an air turbo fan. The fan 170 pumps the air from a bottom of main body 110 and generates a flow to the fins 162 along the assembly direction P10. The air is forced to flow from the vents 145 to external, so that to enhance heat dissipation efficiency for the graphic processing unit 143.

To sum up, in the fourth embodiment, the fan generates an air flow to blow the heat sink, so as to enhance the heat dissipation for the graphic processing unit 143.

In the aforementioned embodiments, it is clearly described that the present invention solves the existing problems by providing the portable electronic device in which the slots to achieve that the external graphic card module can be easily removed and installed according to the user requirement.

The portable electronic device of the present invention achieves that the interface card modules with various can be selectively installed to the portable electronic device according to the user's requirement and the interface card module can be easily removed and replaced, so that the flexibility will be increased. Furthermore, SLI technology for the external graphic card modules can be easily utilized, so that the display performance will be increased to attain the best performance of display function.

The aforementioned descriptions represent merely the preferred embodiment of the present invention, without any intention to limit the scope of the present invention thereto. Various equivalent changes, alterations, or modifications based on the claims of the present invention are all consequently viewed as being embraced by the scope of the present invention.

What is claimed is:

1. A portable electronic device, comprising:
a main body comprising at least one slot at one side of the main body;
a motherboard equipped without a built-in graphics chip, disposed within the main body;
at least one connector, electrically disposed on the motherboard and located corresponding to the slot; and
at least one external graphic card module, including a graphic processing unit, a circuit board, a first connecting interface, a cover, and an exhausting region;
wherein the graphic processing unit is electrically disposed on the circuit board, the cover is disposed on the circuit board and the graphic processing unit is located within the cover, the exhausting region includes a plurality of vents and is communicated with the cover, the first connecting interface is electrically disposed to one end of the circuit board and the exhausting region is disposed to the other end of external graphic card module;
wherein the external graphic card module is removable and selectively inserting into the slot to electrically connect to the connector through the first connecting interface, and the exhausting region is flush with the main body such that the vents are exposed to an outer surface of the main body.

2. The portable electronic device as claimed in claim 1, further comprising a plurality of external graphic card modules; wherein the main body comprises a plurality of slots, the graphic card modules insert into the slots respectively.

3. The portable electronic device as claimed in claim 2, further comprising an interface card module with a second connecting interface; wherein the interface card module inserts into the slot which is not occupied by the external graphic card module, and electrically connected to the connector through the second connecting interface.

4. The portable electronic device as claimed in claim 3, wherein the interface card module is a wireless network interface card, an audio card or a solid state disk.

5. The portable electronic device as claimed in claim 1, wherein the external graphic card module is a hot-plug device.

6. The portable electronic device as claimed in claim 1, further comprising a heat sink disposed within cover of the external graphic card module.

7. The portable electronic device as claimed in claim 6, wherein the heat sink comprises a thermal conducting board and a plurality of fins, one side of the thermal conducting board is attached to the graphic processing unit of the circuit board, and the fins are disposed on the other side of the thermal conducting board.

8. The portable electronic device as claimed in claim 7, further comprising a fan disposed on the circuit board for generating air flow to the fins.

* * * * *